United States Patent
Tomonari et al.

(10) Patent No.: US 10,277,193 B2
(45) Date of Patent: Apr. 30, 2019

(54) CIRCUIT BOARD AND ELECTRONIC CIRCUIT MODULE USING THE SAME

(71) Applicant: TDK Corporation, Tokyo (JP)

(72) Inventors: Toshio Tomonari, Tokyo (JP); Tsutomu Kobayashi, Tokyo (JP); Emi Ito, Yamagata (JP); Yuma Komaya, Tokyo (JP)

(73) Assignee: TDK CORPORATION, Tokyo (JP)

( * ) Notice: Subject to any disclaimer, the term of this patent is extended or adjusted under 35 U.S.C. 154(b) by 64 days.

(21) Appl. No.: 15/605,623

(22) Filed: May 25, 2017

(65) Prior Publication Data

US 2017/0345560 A1 Nov. 30, 2017

(30) Foreign Application Priority Data

May 30, 2016 (JP) .................................. 2016-106897

(51) Int. Cl.
| | |
|---|---|
| *H05K 1/18* | (2006.01) |
| *H01F 27/38* | (2006.01) |
| *H03H 7/42* | (2006.01) |
| *H01F 27/28* | (2006.01) |
| *H01F 27/29* | (2006.01) |

(Continued)

(52) U.S. Cl.
CPC ......... *H03H 7/427* (2013.01); *H01F 27/2823* (2013.01); *H01F 27/29* (2013.01); *H01F 27/292* (2013.01); *H01F 27/38* (2013.01); *H03H 1/00* (2013.01); *H05K 1/0233* (2013.01); *H05K 1/111* (2013.01); *H05K 1/181* (2013.01); *H01F 2017/0093* (2013.01); *H03H 2001/0085* (2013.01); *H03H 2001/0092* (2013.01); *H05K 1/0225* (2013.01); *H05K 1/0245* (2013.01); *H05K 2201/1003* (2013.01); *H05K 2201/1006* (2013.01)

(58) Field of Classification Search
CPC ................. H05K 1/181; H03H 7/427; H03H 2001/0085; H01F 27/38
USPC ................................. 333/181, 185; 336/200
See application file for complete search history.

(56) References Cited

U.S. PATENT DOCUMENTS

2014/0167903 A1* 6/2014 Tomonari .............. H01F 17/045
336/220

FOREIGN PATENT DOCUMENTS

| JP | 2008258464 A | * 10/2008 |
|---|---|---|
| JP | 2008262943 A | * 10/2008 |
| JP | 2012-015395 | 1/2012 |

OTHER PUBLICATIONS

Mikami JP2008258464 English translation; Mikami JP2008262943 English translation.*

* cited by examiner

*Primary Examiner* — Rakesh B Patel
(74) *Attorney, Agent, or Firm* — Young Law Firm, P.C.

(57) ABSTRACT

Disclosed herein is an electronic circuit module that includes a circuit board and a common mode filter mounted on the circuit board. The common mode filter includes first and second terminal electrodes constituting a first pair of terminal electrodes and third and fourth electrodes constituting a second pair of terminal electrodes. The circuit board includes: a first wiring layer having first, second, third, and fourth land patterns connected to the first, second, third, and fourth terminal electrodes, respectively, and first, second, third, and fourth wiring patterns connected to the first, second, third, and fourth land patterns, respectively; and a second wiring layer having a ground pattern that overlaps (Continued)

the first, second, third, and fourth wiring patterns without overlapping the first and second land patterns.

18 Claims, 14 Drawing Sheets

(51) Int. Cl.
    *H03H 1/00*          (2006.01)
    *H05K 1/11*          (2006.01)
    *H05K 1/02*          (2006.01)
    *H01F 17/00*        (2006.01)

CIRCUIT BOARD AND ELECTRONIC CIRCUIT MODULE USING THE SAME

BACKGROUND OF THE INVENTION

Field of the Invention

The present invention relates to a circuit board and, more particularly, to a circuit board on which a common mode filter is mounted. The present invention also relates to an electronic circuit module obtained by mounting a common mode filter on the circuit board.

Description of Related Art

A common mode filter is widely used in many electronic devices, such as mobile electronic devices and on-vehicle LANs, as an element for removing common mode noise superimposed on a differential signal line. In order to maintain symmetry (signal balance) of signals on the differential signal line, a ground pattern needs to be disposed on a circuit board so as to overlap the differential signal line (see Japanese Patent Application Laid-open No. 2012-015395).

However, in a configuration where the entire differential signal line including a land pattern overlaps the ground pattern, signal quality may be degraded with respect to a certain parameter rather than improved. This phenomenon remarkably occurs with respect to a parameter called "Sdc11 characteristics". The sdc11 characteristics indicate a rate at which a common mode signal input to a common mode filter is converted into a differential signal and reflected.

SUMMARY

It is therefore an object of the present invention to provide a circuit board on which a common mode filter is mounted, capable of obtaining higher signal quality.

Another object of the present invention is to provide an electronic circuit module obtained by mounting a common mode filter on the circuit board, capable of obtaining higher signal quality.

The present inventors find through intensive studies that a variation in a capacitance component generated in a land pattern causes the above phenomenon.

The present invention has been made based on such technical findings, and according to the present invention, there is provided a circuit board on which a common mode filter including first and second terminal electrodes constituting a first pair of terminal electrodes and third and fourth electrodes constituting a second pair of terminal electrodes is mounted, the circuit board including: a first wiring layer including first, second, third, and fourth land patterns to be connected respectively to the first, second, third, and fourth terminal electrodes and first, second, third, and fourth wiring patterns connected respectively to the first, second, third, and fourth land patterns; and a second wiring layer including a ground pattern that overlaps the first, second, third, and fourth wiring patterns without overlapping the first and second land patterns.

Further, according to the present invention, there is provided an electronic circuit module including: a circuit board; and a common mode filter mounted on the circuit board, the common mode filter including first and second terminal electrodes constituting a first pair of terminal electrodes and third and fourth electrodes constituting a second pair of terminal electrodes. The circuit board includes: a first wiring layer having first, second, third, and fourth land patterns connected to the first, second, third, and fourth terminal electrodes, respectively, and first, second, third, and fourth wiring patterns connected to the first, second, third, and fourth land patterns, respectively; and a second wiring layer having a ground pattern that overlaps the first, second, third, and fourth wiring patterns without overlapping the first and second land patterns.

According to the present invention, since the first and second land patterns do not overlap the ground pattern, a capacitance component between the first and second land patterns and the ground pattern is eliminated or reduced. Thus, a change in the capacitance component due to a variation in the amount and a wet state of a solder or a variation in the mounting position and inclination of the common mode filter is reduced, whereby high signal quality can be obtained.

In the present invention, it is preferable that the first and second wiring patterns are a pair of input wiring patterns transmitting a signal to be input to the common mode filter, and the third and fourth wiring patterns are a pair of output wiring patterns transmitting a signal output from the common mode filter. With this configuration, a variation in a capacitance component at the input part is suppressed, making it possible to improve Sdc11 characteristics.

In the present invention, the ground pattern preferably overlaps the third and fourth land patterns. This can prevent degradation in signal balance due to excessive removal of the ground pattern.

In the present invention, it is referable that the common mode filter further includes: a core having a winding core part, a first flange part provided at one end of the winding core part in an axial direction thereof, and a second flange part provided at other end of the winding core part in the axial direction, the first and second terminal electrodes being provided on the first flange, the third and fourth terminal electrodes being provided on the second flange; a first wire wound around the winding core part, the first wire having one end connected to the first terminal electrode and other end connected to the third terminal electrode; and a second wire wound around the winding core part, the second wire having one end connected to the second terminal electrode and other end connected to the fourth terminal electrode. The first and second wires cross each other on the winding core part. With this configuration, the positions of the first and second wires are replaced with each other with the crossing position as a boundary, thereby allowing signal balance to be further improved.

In this case, it is preferable that the winding core part includes first, second, third, and fourth winding regions arranged in this order from the first flange part toward the second flange part, the first and second wires are bifilar-wound in both the first and fourth winding regions and layer-wound in both the second and third winding regions, and the first and second wires cross each other between the second and third winding regions. With this configuration, the bifilar-wound part is inserted between the layer-wound part and the first flange part and between the layer-wound part and the second flange part, so that a predetermined distance is ensured between the layer-wound part and the first and second flange parts. The layer-wound part has a higher winding density than the bifilar-wound part, so that an unnecessary parasitic capacitance may be generated when the distance between the layer-wound part and the first or second flange part is small. However, with the above configuration, a sufficient distance is ensured between the layer-wound part and the first and second flange parts, so that the unnecessary parasitic capacitance component is suppressed from occurring, thereby allowing high-frequency characteristics to be improved.

Further, in this case, it is preferable that the numbers of turns of the first and second wires in the first winding region and those of the first and second wires in the fourth winding region are the same as each other and the numbers of turns of the first and second wires in the second winding region and those of the first and second wires in the third winding region are the same as each other. With this configuration, the first and second wires are symmetric with respect to the crossing position, thereby allowing signal balance to be further improved.

Further, in this case, it is preferable that the second wire is wound on the first wire in the second winding region and the first wire is wound on the second wire in the third winding region. With this configuration, the vertical positions of the first and second wires are replaced with each other between the layer-wound parts of the second and third winding parts, thereby allowing signal balance to be further improved.

As described above, according to the present invention, there can be provided a circuit board capable of obtaining higher signal quality and an electronic circuit module using the circuit board.

BRIEF DESCRIPTION OF THE DRAWINGS

The above features and advantages of the present invention will be more apparent from the following description of certain preferred embodiments taken in conjunction with the accompanying drawings, in which.

DETAILED DESCRIPTION OF THE EMBODIMENTS

Preferred embodiments of the present invention will be explained below in detail with reference to the accompanying drawings.

Figure 1:
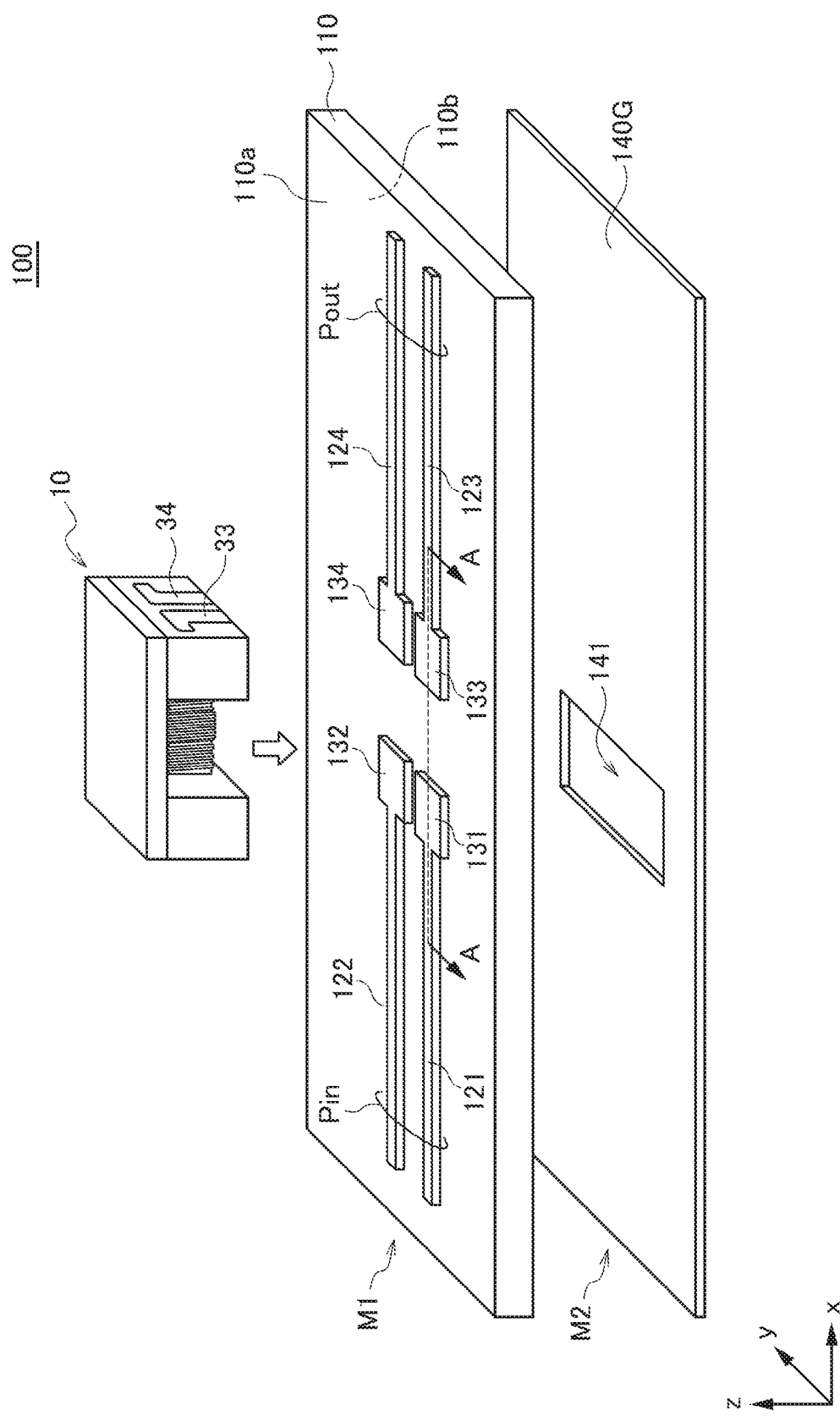
FIG. 1 is a schematic exploded perspective view for explaining the configuration of a main part of an electronic circuit module according to an embodiment of the present invention.
Figure 2:
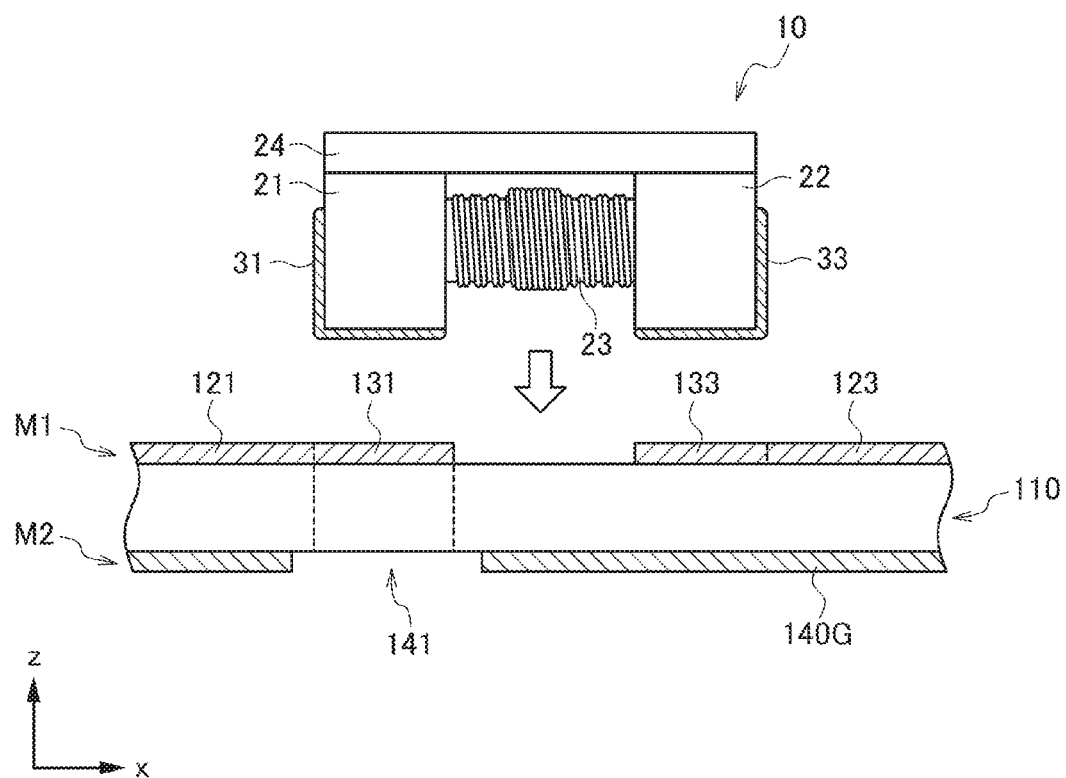
FIG. 2 is a schematic cross-sectional view taken along line A-A of FIG. 1.

FIG. 1 is a schematic exploded perspective view for explaining the configuration of a main part of an electronic circuit module 100 according to an embodiment of the present invention. FIG. 2 is a schematic cross-sectional view taken along line A-A of FIG. 1.

The electronic circuit module 100 illustrated in FIG. 1 includes a circuit board 110 and a common mode filter 10 mounted on the circuit board 110. In the example of FIG. 1, the circuit board 110 is a single-layer circuit board. A first wiring layer M1 is formed on one surface 110a, and a second wiring layer M2 is formed on the other surface 110b. FIG. 1 illustrates a state where the second wiring layer M2 is separated from the surface 110b of the circuit board 110. The first wiring layer M1 includes first to fourth wiring patterns 121 to 124 and first to fourth land patterns 131 to 134 connected respectively to the first to fourth wiring patterns 121 to 124. The second wiring layer M2 includes a ground pattern 140G having a large area.

The electronic circuit module 100 is a module component used in mobile electronic devices or on-vehicle LANs and is mounted with a large number of electronic components (active component such as a semiconductor IC or a transistor, passive component such as a capacitor or a resistor, and the like) for achieving its function. In FIG. 1, only a part of the electronic circuit module 100 on which the common mode filter 10 is mounted is extracted for illustration.

The first and second wiring patterns 121 and 122 constitute a pair of input wiring patterns Pin which are used for transmitting a differential signal to be input to the common mode filter 10. The third and fourth wiring patterns 123 and 124 constitute a pair of output wiring patterns Pout which are used for transmitting a differential signal output from the common mode filter 10. The pair of input wiring patterns Pin and pair of output wiring patterns Pout are connected to unillustrated electronic components.

The first to fourth land patterns 131 to 134 are connected respectively to first to fourth terminal electrodes 31 to 34 provided in the common mode filter 10. The configuration of the common mode filter 10 will be described later.

The ground pattern 140G is so-called a solid pattern having a large area and is disposed at a position overlapping at least the wiring patterns 121 to 124 in a plan view (viewed in the z-direction). This ground pattern 140G is provided for maintaining balance between a pair of signals on a high-speed differential signal line.

As illustrated in FIGS. 1 and 2, in the present embodiment, a clearance region 141 is provided in the ground pattern 140G. The clearance region 141 is a cut part formed in the ground pattern 140G. That is, the ground pattern 140G is removed at the clearance region 141. In the present embodiment, the clearance region 141 overlaps the first and second land patterns 131 and 132 in a plan view and, accordingly, the first and second land patterns 131 and 132 do not overlap the ground pattern 140G. As a result, a capacitance component generated between the first and second land patterns 131 and 132 and the ground pattern 140G is eliminated or reduced, so that a variation in the capacitance component is significantly reduced.

Figure 3:
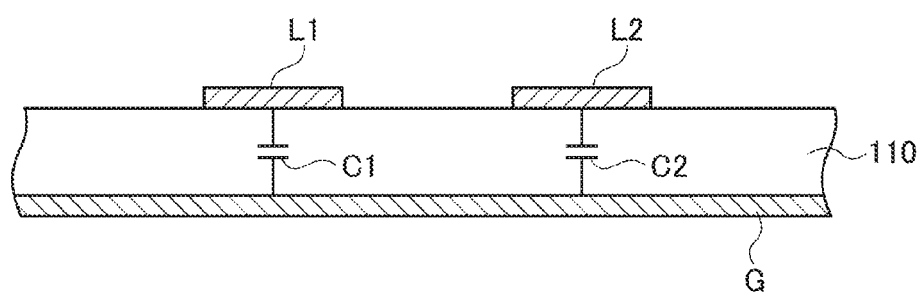
FIG. 3 is a cross-sectional view for explaining a capacitance component generated between a land pattern and a ground pattern.

FIG. 3 is a cross-sectional view for explaining a capacitance component generated between a land pattern and a ground pattern.

Normally, as illustrated in FIG. 3, capacitance components C1 and C2 are generated between land patterns L1 and L2 and a ground pattern G since the entire differential signal line including the land patterns L1 and L2 overlaps the ground pattern G. Thus, when the land patterns L1 and L2 are a pair of land patterns that constitute the input side of the common mode filter 10, the capacitance components C1 and C2 each serve as an input capacitance of the common mode filter. However, it is difficult to make values of the capacitance components C1 and C2 completely coincide with each other, and values of the capacitance components C1 and C2 slightly change due to various factors such as a variation in the amount and a wet state of a solder for connection to the terminal electrodes of the common mode filter or a variation in the mounting position and inclination of the common mode filter. Such a variation is difficult to control or uncontrollable at designing and at manufacturing.

However, as illustrated in FIGS. 1 and 2, in the present embodiment, the clearance region 141 is provided immediately below the land patterns 131 and 132. Thus, on the input side, the capacitance components C1 and C2 are not generated or significantly reduced. As a result, even when a variation described above occurs, a variation in the input capacitance is hardly generated. Thus, particularly, the Sdc11 characteristics can be made extremely satisfactory.

Figure 4:
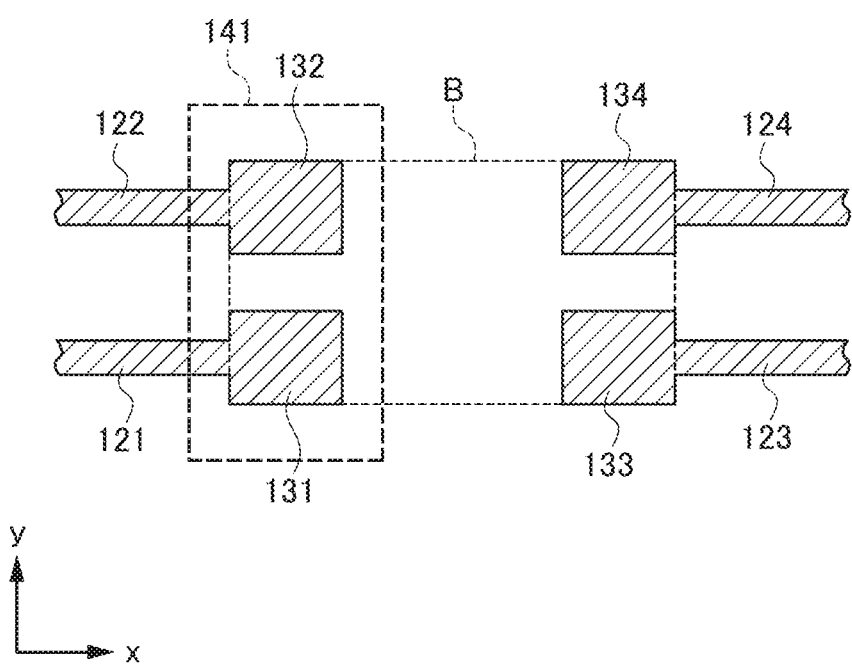
FIG. 4 is a schematic plan view for explaining the plane position of a clearance region.

FIG. 4 is a schematic plan view for explaining the plane position of the clearance region 141. In FIG. 4 a region surrounded by the dashed line B is a mounting region of the common mode filter 10.

As illustrated in FIG. 4, in the present embodiment, the first and second land patterns 131 and 132 completely overlap the clearance region 141. In other words, the first and second land patterns 131 and 132 do not overlap the ground pattern 140G in a plan view. This allows the capacitance component generated between the first and second land patterns 131 and 132 and the ground pattern 140G to be reliably eliminated or reduced.

There may be a case where the terminal electrodes 31 and 32 of the common mode filter 10 to be mounted each have a larger planar size than that of each of the first and second land patterns 131 and 132. In this case, when the common mode filter 10 is mounted on the circuit board 110, the terminal electrodes 31 and 32 protrude respectively from the first and second land patterns 131 and 132 in a plan view. In such a case, it is desirable to make not only the first and second land patterns 131 and 132, but also the entire area of each of the terminal electrodes 31 and 32 overlaps the clearance region 141.

Figure 5:
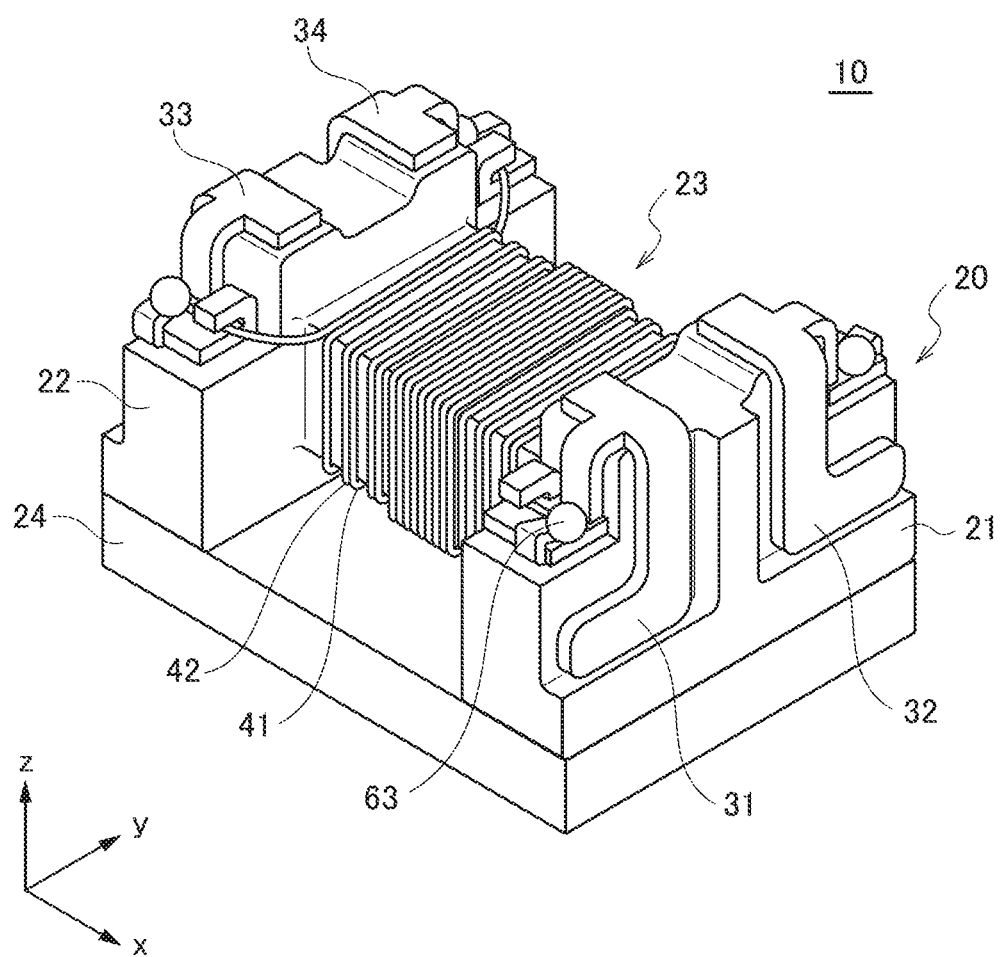
FIG. 5 is a schematic perspective view illustrating an outer appearance of a common mode filter.

FIG. 5 is a schematic perspective view illustrating the outer appearance of a common mode filter 10.

Figure 6:
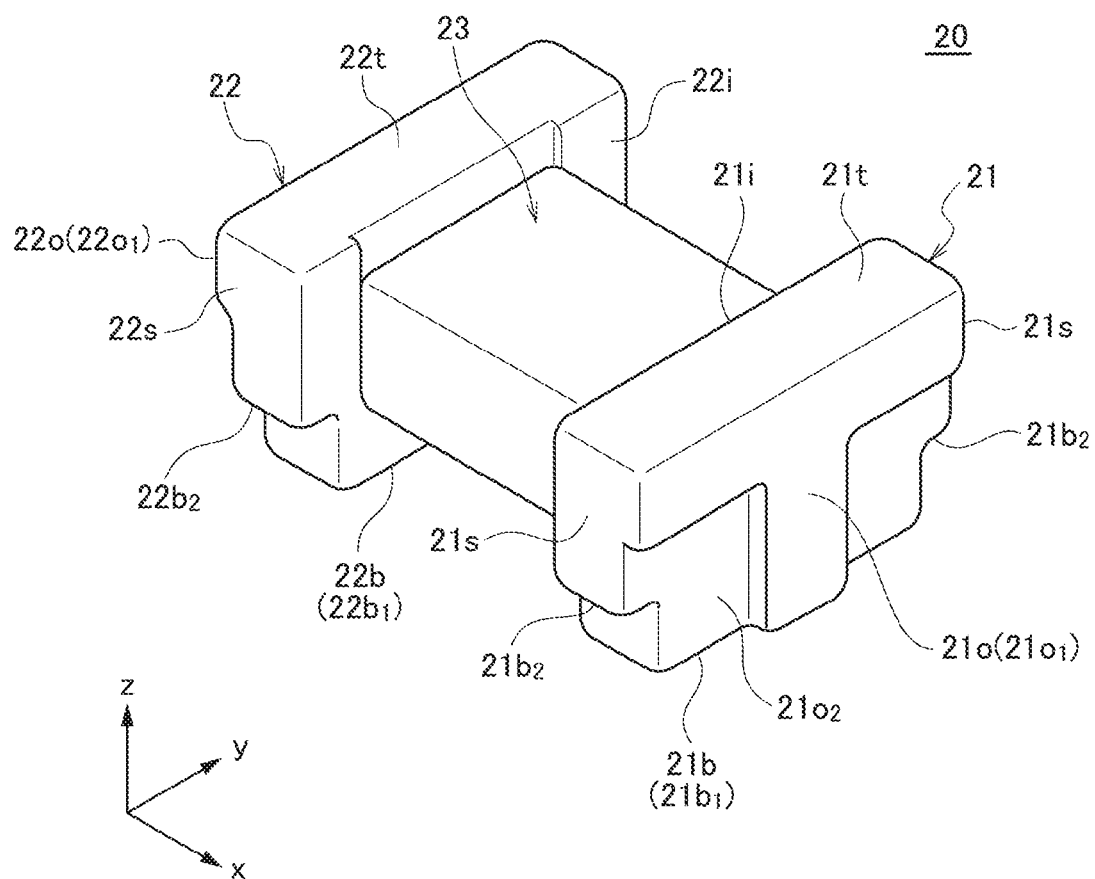
FIG. 6 is a schematic perspective view illustrating the core shown in FIG. 5.
Figure 7:
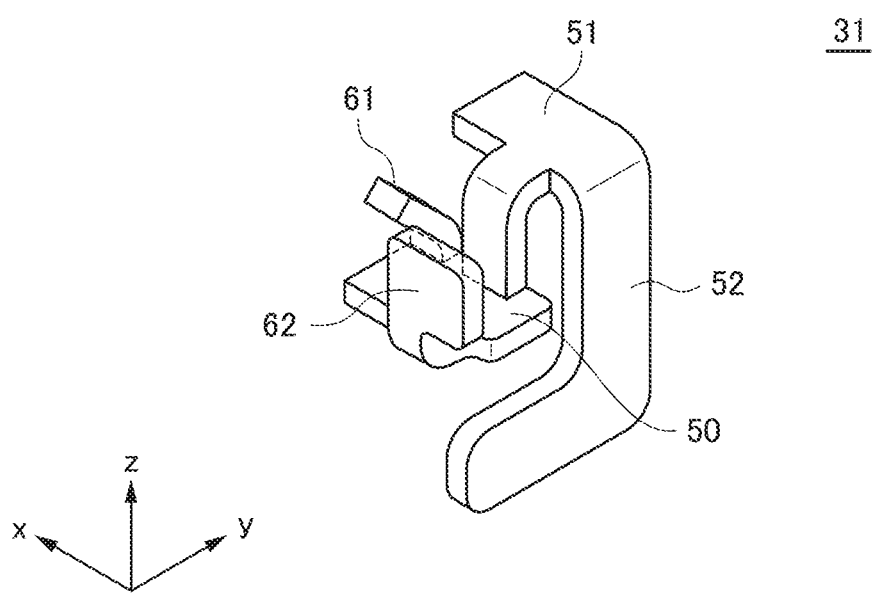
FIG. 7 is a schematic perspective view illustrating the first terminal electrode shown in FIG. 5.

As illustrated in FIG. 5, the common mode filter 10 includes a drum core 20, a plate core 24, first to fourth terminal electrodes 31 to 34, and first and second wires 41 and 42. The structure of the core 20 is illustrated in FIG. 6, and the structure of the first terminal electrode 31 is illustrated in FIG. 7. The cores 20 and 24 are each formed of a magnetic material having a comparatively high permeability, such as an Ni—Zn based ferrite. The first to fourth terminal electrodes 31 to 34 are each a metal fitting formed of a good conductor material such as copper.

The core 20 has a first flange part 21, a second flange part 22, and a winding core part 23 disposed between the first and second flange parts 21 and 22. The winding core part 23 has its axis direction in the x-direction. The first and second flange parts 21 and 22 are disposed at opposite ends of the winding core part 23 in the axial direction and integrally formed with the winding core part 23. The first flange part 21 has an inner side surface 21$i$ connected to the winding core part 23, an outer side surface 21$o$ positioned on the side opposite the inner side surface 21$i$, a top surface 21$t$ to which the plate core 24 is bonded, a bottom surface 21$b$ positioned on the side opposite the top surface 21$t$, and side surfaces 21$s$ positioned so as to be opposite each other. The inner side surface 21$i$ and outer side surface 21$o$ each constitute the yz plane, the top surface 21$t$ and bottom surface 21$b$ each constitute the xy plane, and the side surfaces 21$s$ each constitute the xz plane. Similarly, the second flange part 22 has an inner side surface 22$i$ and an outer side surface 22$o$ each constituting the yz plane, a top surface 22$t$ and a bottom surface 22$b$ each constitute the xy plane, and two side surfaces 22$s$ each constitute the xz plane.

As illustrated in FIG. 6, the bottom surfaces 21$b$, 22$b$ and outer side surfaces 21$o$, 22$o$ each have a step. Specifically, the bottom surface 21$b$ has an upper stage surface 21$b_1$ and a lower stage surface 21$b_2$, the bottom surface 22$b$ has an upper stage surface 22$b_1$ and a lower stage surface 22$b_2$, the outer side surface 21$o$ has an upper stage surface 21$o_1$ and a lower stage surface 21$o_2$, and the outer side surface 22$o$ has an upper stage surface 22$o_1$ and a lower stage surface 22$o_2$. The first and second terminal electrodes 31 and 32 are disposed so as to cover the upper stage surface 21$b_1$, lower stage surface 21$b_2$, and lower stage surface 21$o_2$ of the first flange part 21, and the third and fourth terminal electrodes 33 and 34 are disposed so as to cover the upper stage surface 22$b_1$, lower stage surface 22$b_2$, and lower stage surface 22$o_2$ of the second flange part 22. The fixing of the first to fourth terminals 31 to 34 is made by using an adhesive or the like.

As illustrated in FIG. 7, the first terminal electrode 31 has a wire connection part 50, a first connection part 51, and a second connection part 52. The wire connection part 50 is a part that covers the lower stage surface 21$b_2$ of the bottom surface 21$b$ and is connected with one end of the first wire 41. As illustrated in FIG. 7 which illustrates a state before wire connection, the wire connection part 50 has a fixing piece 61 for holding one end of the first wire 41 and a welding piece 62 for welding the one end of the first wire 41 thereto. Specifically, the wire connection is made as follows. That is, in a state where the fixing piece 61 is folded to hold the one end of the first wire 41, the welding piece 62 is folded to hold the one end of the first wire 41 between the wire connection part 50 and the welding piece 62, and then laser beam is irradiated to melt the welding piece 62, to thereby weld the one end of the first wire 41 to the wire connection part 50. After the welding, a weld ball 63 illustrated in FIG. 5 is formed, whereby the one end of the first wire 41 and the wire connection part 50 are firmly fixed.

The first connection part 51 is a part that covers the upper stage surface 21$b_1$ of the bottom surface 21$b$ and faces a land pattern on a printed circuit board at mounting. The second connection part 52 is a part that covers the lower stage surface 21$o_2$ of the outer side surface 21$o$ and is a part at which a solder fillet is formed at mounting. In the present embodiment, the second connection part 52 has a shape folded in an L-shape, which enhances mounting strength.

Other terminal electrodes 32 to 34 have the same structure. The one and the other ends of the first wire 41 are connected to the first and third terminal electrodes 31 and 33, respectively, and one and the other ends of the second wire 42 are connected to the second and fourth terminal electrodes 32 and 34, respectively. As a result, common mode filter circuitry is formed in which, for example, a pair of the first and second terminal electrodes 31 and 32 serve as an input side and a pair of the third and fourth terminal electrodes 33 and 34 serve as an output side. However, the common mode filter 10 shown in FIG. 5 has no directivity, so that it is possible to use the pair of third and fourth terminal electrodes 33 and 34 as the input side and the pair of the first and second terminal electrodes 31 and 32 as the output side. Further, the terminal electrodes 31 to 34 each have the structure illustrated in FIG. 7, so that firm connection to the corresponding wires 41 and 42 can be made. In addition, the weld ball 63 is formed in the lower stage surfaces $21b_2$ and $22b_2$ of the bottom surfaces $21b$ and $22b$, so that it is possible to prevent unstable mounting which may be caused due to interference between the weld ball 63 and the circuit board 110.

The first and second wires 41 and 42 are not particularly limited in terms of a winding pattern and may be subjected to bifilar winding or layer winding. The "bifilar winding" is a type of winding where a pair of wires is wound in parallel in the same turn. The "layer winding" is a type of winding where one of a pair of wires is wound in a lower layer to form a first winding layer, and the other one thereof is wound on the first winding layer to form a second winding layer. The bifilar winding can provide more satisfactory signal balance than the layer winding. The layer winding can ensure a larger number of turns than the bifilar winding (or when the number of turns is the same, the winding core part 23 can be made smaller in size).

As described above, the first and second wires 41 and 42 are not particularly limited in terms of a winding pattern in the present invention; however, preferably, the first and second wires 41 and 42 are made to cross each other in the middle of the winding. This is because effects of the present embodiment may not be recognized since a variation in signal balance in the common mode filter itself is large in a normal winding pattern where wires are not made to cross each other. On the other hand, when the first and second wires 41 and 42 are made to cross each other in the middle of the winding, a variation in signal balance in the common mode filter itself is significantly reduced, thus allowing effects of the present invention to be recognized.

Hereinafter, some preferred winding layouts of the first and second wires 41 and 42 will be described.

Figure 8:
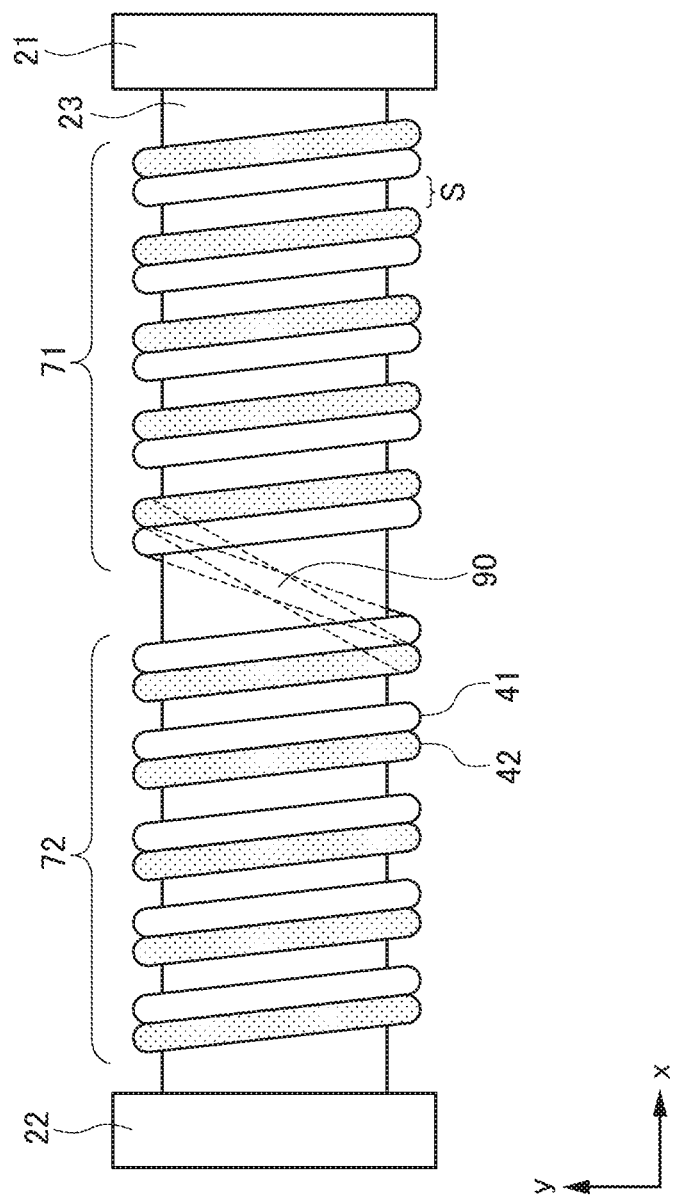
FIG. 8 is a view for explaining a first winding layout.

FIG. 8 is a view for explaining a first winding layout.

In the example of FIG. 8, the bifilar-wound first and second wires 41 and 42 are made to cross each other at a cross point 90 in the middle of the winding to thereby replace the positions of the first and second wires 41 and 42 with each other. The cross point 90 is positioned almost in the middle of the first and second wires 41 and 42. More specifically, in the example of FIG. 8, the cross point 90 is positioned between 5-th and 6-th turns. Thus, the first and second wires 41 and 42 are wound by five turns in a first winding region 71 positioned on the first flange part 21 side as viewed from the cross point 90, and similarly, in a second winding region 72 positioned on the second flange part 22 side as viewed from the cross point 90, the first and second wires 41 and 42 are wound by five turns.

With the above configuration, the first and second wires 41 and 42 are symmetric with each other with respect to the cross point 90. The symmetric relationship is satisfied in terms of not only the numbers of turns of the first and second wires 41 and 42, but also the positional relationship thereof between the first and second winding regions 71 and 72. That is, in the first winding region 71, the first and second wires 41 and 42 in the same turn are positioned on the second flange part 22 side and on the first flange part 21 side, respectively, while in the second winding region 72, the first and second wires 41 and 42 in the same turn are positioned on the first flange part 21 side and on the second flange part 22 side, respectively. In other words, in both the first and second winding regions 71 and 72, the first and second wires 41 and 42 in the same turn are positioned at the inner side (cross point 90 side) and at the outer side (flange part 21 or 22 side), respectively. This further improves signal balance.

Further, in the example of FIG. 8, the first and second wires 41 and 42 in the same turn are wound adjacently, preferably, in contact with each other. This allows satisfactory signal balance to be obtained. On the other hand, a space S is formed between the adjacent turns of the first and second wires 41 and 42. For example, the second turn of the first wire 41 and the first turn of the second wire 42 do not contact each other, and the space S is formed therebetween in the x-direction. This reduces a parasitic capacitance component generated between the adjacent turns, thereby improving high-frequency characteristics.

The winding layout illustrated in FIG. 8 is preferably adopted in a case where the required number of turns is comparatively small, or where the length of the winding core part 23 in the x-direction is comparatively long.

Figure 9:
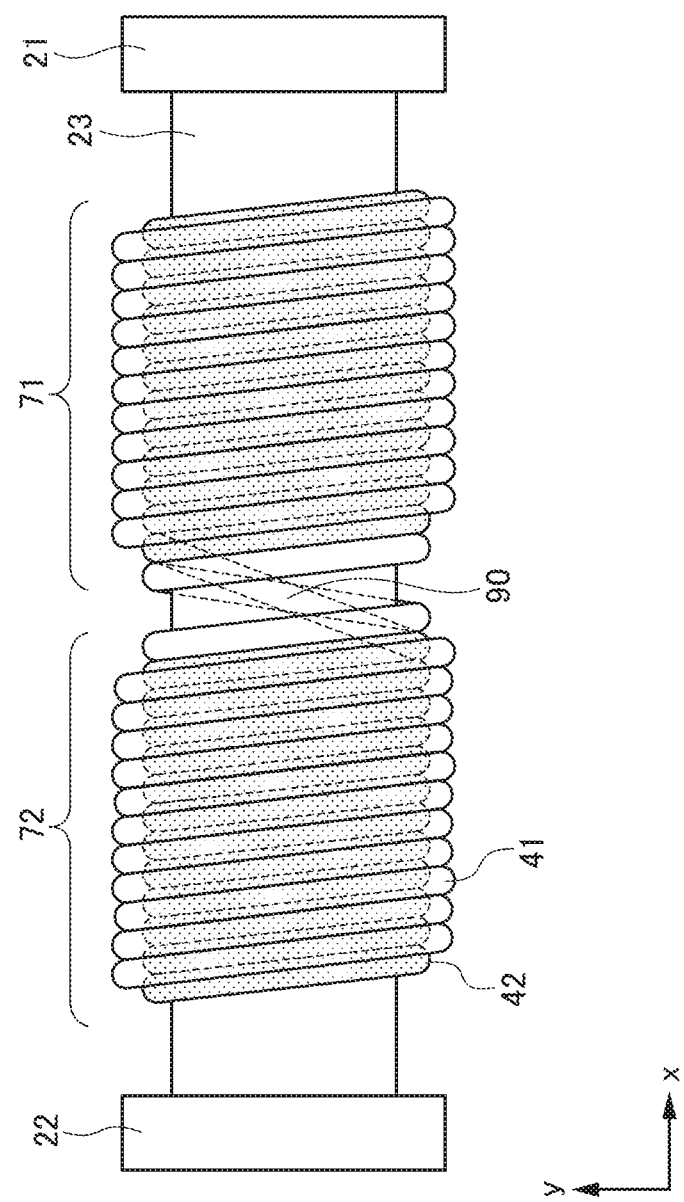
FIG. 9 is a view for explaining a second winding layout.

FIG. 9 is a view for explaining a second winding layout.

In the example of FIG. 9, the first and second wires 41 and 42 that are layer-wound are made to cross each other at the cross point 90 in the middle of the winding to thereby replace the positions of the first and second wires 41 and 42 with each other. In this example, the second wire 42 is wound in the lower layer, and the first wire 41 is wound on the second wire 42. The cross point 90 is positioned almost in the middle of the first and second wires 41 and 42. More specifically, in the example of FIG. 9, the cross point 90 is positioned between 12-th and 13-th turns. Thus, the first and second wires 41 and 42 are wound by 12 turns in the first winding region 71 positioned on the first flange part 21 side as viewed from the cross point 90, and similarly, in the second winding region 72 positioned on the second flange part 22 side as viewed from the cross point 90, the first and second wires 41 and 42 are wound by 12 turns.

With the above configuration, the first and second wires 41 and 42 are symmetric with each other with respect to the cross point 90. Further, like the example of FIG. 8, the symmetric relationship is satisfied in terms of not only the numbers of turns of the first and second wires 41 and 42, but also the positional relationship thereof between the first and second winding regions 71 and 72, thereby further improving signal balance.

In this layout, the first wire 41 is partially wound in the lower layer like the second wire 42. This is because, in the layer winding, the number of turns of the wire in the upper layer is smaller by one than that of the wire in the lower layer since the wire in the upper layer is wound along a valley line formed by the wire in the lower layer for stabilization of a winding state. That is, when the numbers of turns of the pair of wires are made to coincide with each other in the layer winding, one turn of the wire to be wound in the upper layer is inevitably dropped to the lower layer. In the example of FIG. 9, the dropped turns are positioned on the cross point 90 side; alternatively, however, they may be positioned on the flange parts 21 and 22 sides, respectively.

The winding layout illustrated in FIG. 9 is preferably adopted in a case where the required number of turns is comparatively large, or where the length of the winding core part 23 in the x-direction is comparatively short.

As described above, the bifilar winding and layer winding each have merits and demerits, so that which one of the bifilar winding and layer winding is used may be determined depending on the characteristics required. Further, to obtain merits of both the bifilar winding and layer winding, a method can be adopted in which a part of the wire is bifilar-wound, and the remaining part thereof is layer-wound.

Figure 10:
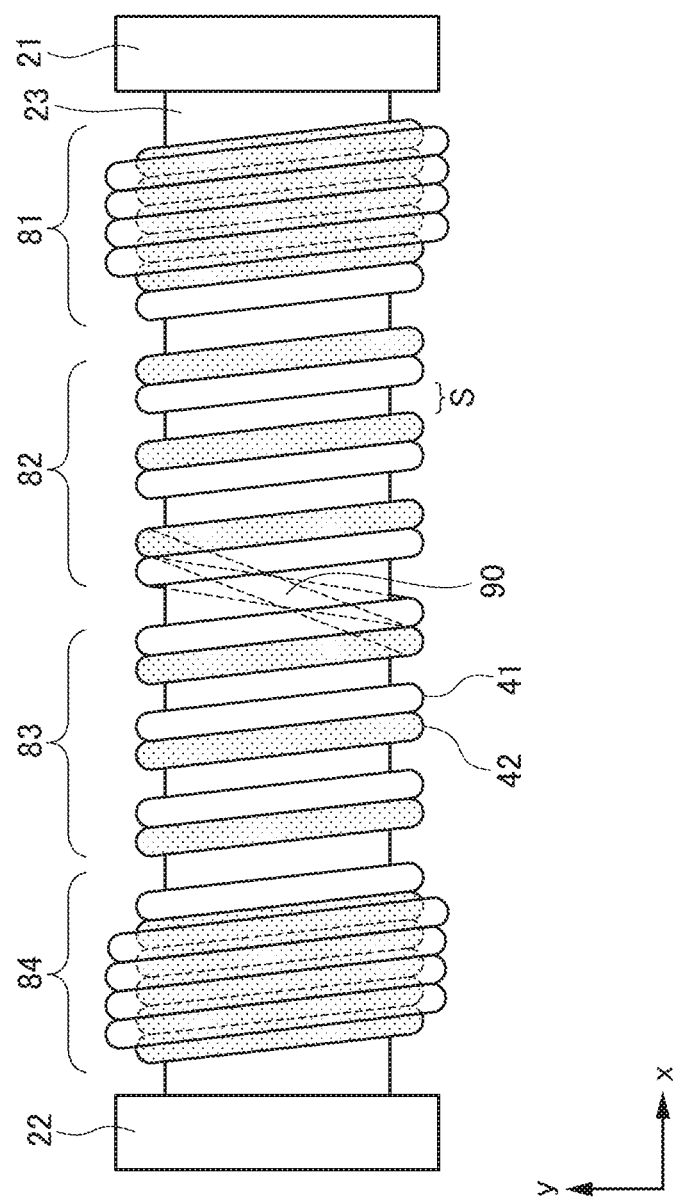
FIG. 10 is a view for explaining a third winding layout.

FIG. 10 is a view for explaining a third winding layout.

In the example of FIG. 10, the winding core part 23 is divided into four winding regions 81 to 84. The first and second wires 41 and 42 are layer-wound in the first and fourth winding regions 81 and 84, while they are bifilar-wound in the second and third winding regions 82 and 83. The winding regions 81 to 84 are arranged in this order from the first flange part 21 side toward the second flange part 22 side.

In this example, in both the first and fourth winding regions 81 and 84, the second wire 42 is wound in the lower layer, and the first wire 41 is wound on the second wire 42. However, as described above, in the layer winding, one turn of the wire to be wound in the upper layer is dropped to the lower layer. Thus, one turn of the first wire 41 is dropped to the lower layer in the first and fourth winding regions 81 and 84. In the example of FIG. 10, the dropped turns are positioned on the cross point 90 side; alternatively, however, they may be positioned on the flange parts 21 and 22 sides, respectively.

In this example, the first and second wires 41 and 42 are each wound by five turns in both the first and fourth winding regions 81 and 84, and the first and second wires 41 and 42 are each wound by three turns in both the second and third winding regions 82 and 83. With this configuration, both an increase in the number of turns and improvement in the signal balance can be achieved.

In this example as well, the first and second wires 41 and 42 are made to cross each other at the cross point 90 between the second and third winding regions 82 and 83 to replace the positions of the first and second wires 41 and 42. With this configuration, the first and second wires 41 and 42 are symmetric with each other with respect to the cross point 90. The symmetric relationship is satisfied in terms of not only the numbers of turns of the first and second wires 41 and 42, but also the positional relationship thereof between the first and fourth winding regions 81 and 84 and that between the second and third winding regions 82 and 83, whereby signal balance is further improved.

Figure 11:
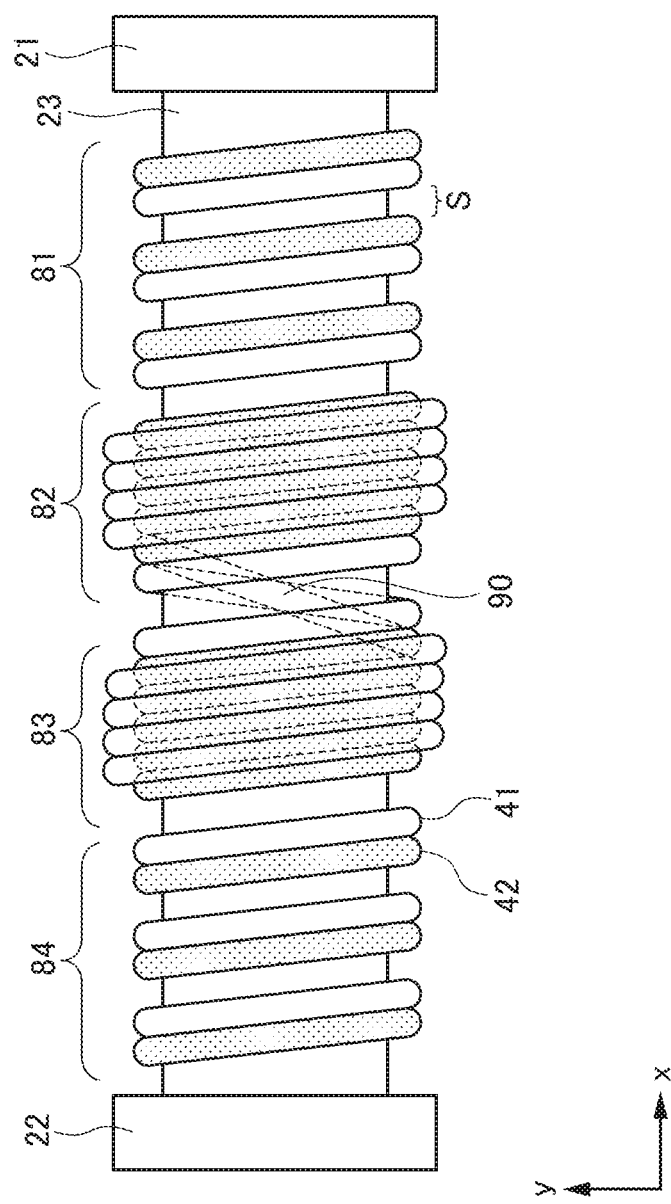
FIG. 11 is a view for explaining a fourth winding layout.

FIG. 11 is a view for explaining a fourth winding layout.

In the example of FIG. 11, the winding core part 23 is divided into four winding regions 81 to 84. The first and second wires 41 and 42 are bifilar-wound in the first and fourth winding regions 81 and 84, while they are layer-wound in the second and third winding regions 82 and 83.

In this example, in both the second and third winding regions 82 and 83, the second wire 42 is wound in the lower layer, and the first wire 41 is wound on the second wire 42. However, as described above, in the layer winding, one turn of the wire to be wound in the upper layer is dropped to the lower layer. Thus, one turn of the first wire 41 is dropped to the lower layer in the second and third winding regions 82 and 83. In the example of FIG. 11, the dropped turns are positioned on the cross point 90 side.

In this example, the first and second wires 41 and 42 are each wound by three turns in both the first and fourth winding regions 81 and 84, and the first and second wires 41 and 42 are each wound by five turns in both the second and third winding regions 82 and 83. With this configuration, both an increase in the number of turns and improvement in the signal balance can be achieved.

In this example as well, the first and second wires 41 and 42 are made to cross each other at the cross point 90 between the second and third winding regions 82 and 83 to replace the positions of the first and second wires 41 and 42. With this configuration, the first and second wires 41 and 42 are symmetric with each other with respect to the cross point 90. The symmetric relationship is satisfied in terms of not only the numbers of turns of the first and second wires 41 and 42, but also the positional relationship thereof between the first and fourth winding regions 81 and 84 and that between the second and third winding regions 82 and 83, whereby signal balance is further improved.

The first and second wires 41 and 42 can be wound with higher density in the layer winding than in the bifilar winding, so that it is possible to increase the numbers of turns of the first and second wires 41 and 42 while suppressing the length of the winding core part 23 in the x-direction. However, in the layer winding, a parasitic capacitance is likely to be generated between the layer-wound part and other member because of the high winding density. Particularly, when the layer-wound part is laid out in the vicinity of the first flange part 21 or second flange part 22, a slight parasitic capacitance may be generated between the layer-wound part and the first to fourth terminal electrodes 31 to 34, resulting in degradation in high-frequency characteristics. However, in the example of FIG. 11, the layer-wound part is laid out in the second and third winding regions 82 and 83 separated away from the first and second flange parts 21 and 22, so that the above-mentioned parasitic capacitance component is suppressed from occurring, thereby allowing high-frequency characteristics to be improved.

Figure 12:
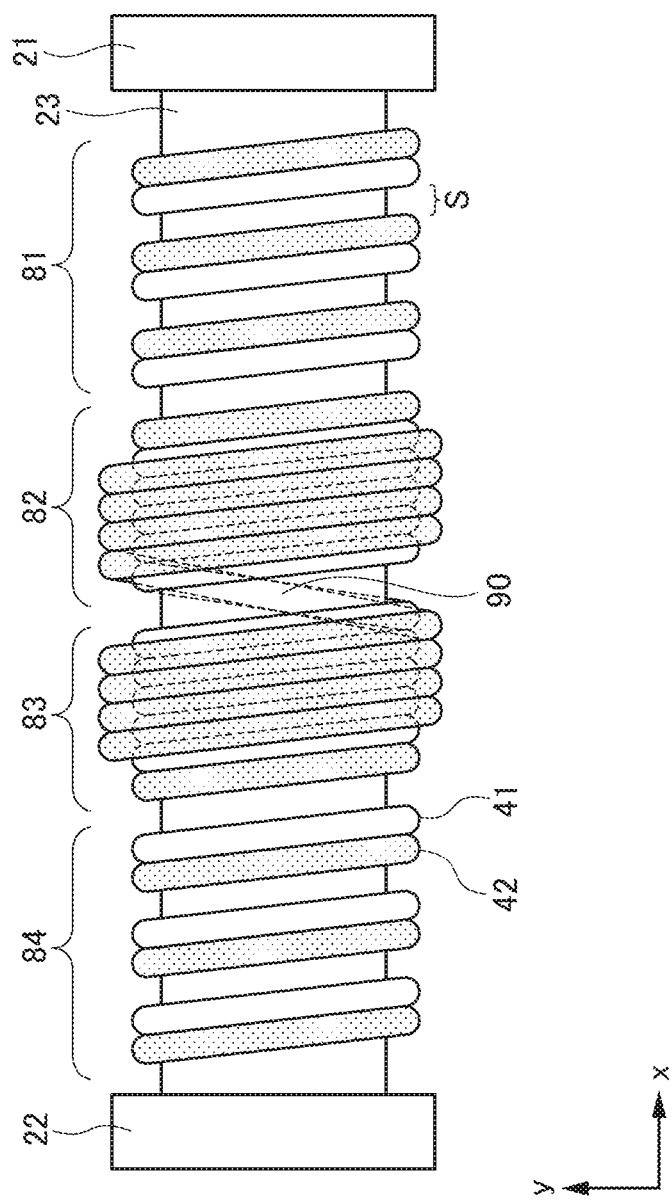
FIG. 12 is a view for explaining a fifth winding layout.

FIG. 12 is a view for explaining a fifth winding layout.

The winding layout illustrated in FIG. 12 differs from the winding layout illustrated in FIG. 11 in the winding layout of the second and third winding regions 82 and 83. Other configurations are the same as the winding layout of FIG. 11, so the same reference numerals are given to the same elements, and overlapping description will be omitted.

In this example, in both the second and third winding regions 82 and 83, the first wire 41 is wound in the lower layer, and the second wire 42 is wound on the first wire 41. However, as described above, in the layer winding, one turn of the wire to be wound in the upper layer is dropped to the lower layer. Thus, one turn of the second wire 42 is dropped to the lower layer in the second and third winding regions 82 and 83. In the example of FIG. 12, the dropped turns are positioned on the opposite side to the cross point 90, i.e., between the first and second winding regions 81 and 82 and between the third and fourth winding regions 83 and 84, respectively.

With this configuration, the dropped turns of the layer winding are positioned more outside, so that the actually layer-wound part (layer-wound part except the dropped turn part) concentrates more on the center. That is, the distance between the actually layer-wound part and the first to fourth terminal electrodes 31 to 34 becomes larger. Thus, in addition to the effect obtained by the winding layout of FIG. 11, further reduction of the parasitic capacitance component is expected.

Figure 13:
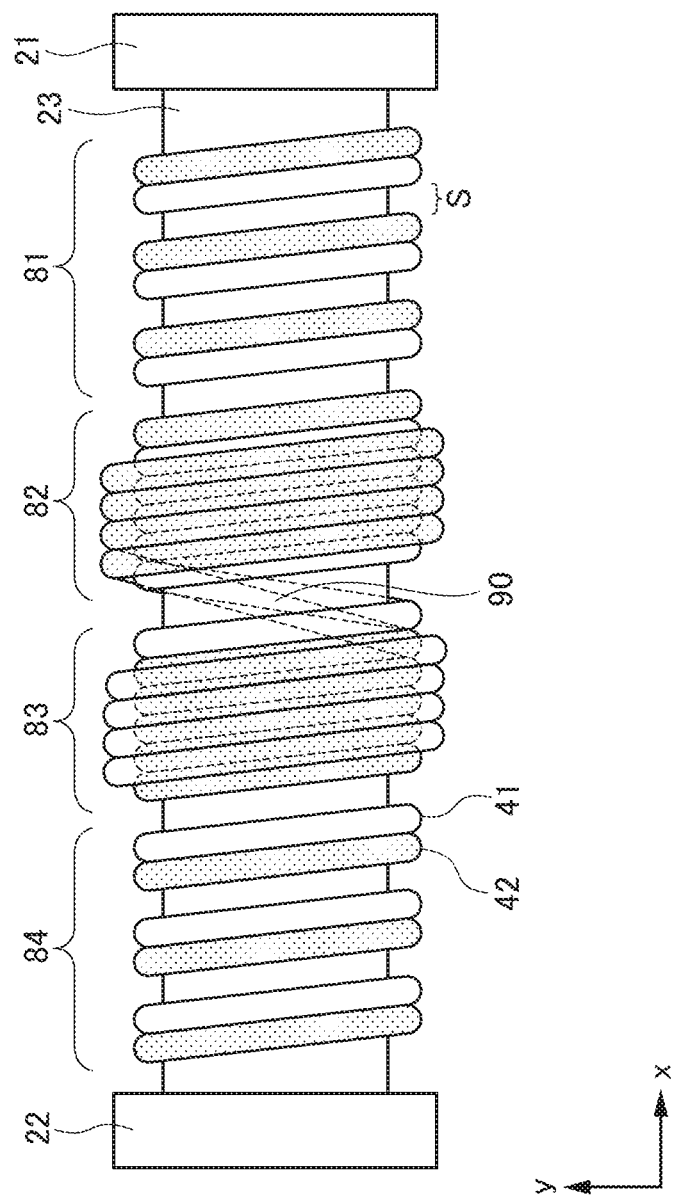
FIG. 13 is a view for explaining a sixth winding layout.

FIG. 13 is a view for explaining a sixth winding layout.

The winding layout illustrated in FIG. 13 is the same as that illustrated in FIG. 11 with respect to the winding pattern in the third winding region 83 and the same as that illustrated in FIG. 12 with respect to the winding pattern in the second winding region 82. Other configurations are the same as the winding layout of FIG. 11 or FIG. 12, so the same reference numerals are given to the same elements, and overlapping description will be omitted.

As described above, the second wire 42 is wound on the first wire 41 in the second winding region 82, and the first wire 41 is wound on the second wire 42 in the third winding region 83. The dropped turns are positioned on the first flange part 21 side.

With this configuration, the upper and lower layers are replaced with each other with the cross point 90 as a boundary, so that there is almost no difference between the winding conditions of the first and second wires 41 and 42. This improves signal balance more than in the winding layout illustrated in FIG. 11 or FIG. 12, so that significantly improved high-frequency characteristics can be obtained.

While some winding layouts of the first and second wires 41 and 42 have been described, effects obtained by the present embodiment, that is, the effect of improving signal balance obtained by providing the clearance region 141 immediately below the first and second land patterns 131 and 132 becomes meaningful as a variation in signal balance in the common mode filter itself is small. Thus, as described above, although the first and second wires 41 and 42 are not particularly limited in terms of the winding layout, they are preferably made to cross each other at the cross point 90 in the middle of the winding.

It is apparent that the present invention is not limited to the above embodiments, but may be modified and changed without departing from the scope and spirit of the invention.

Figure 14:
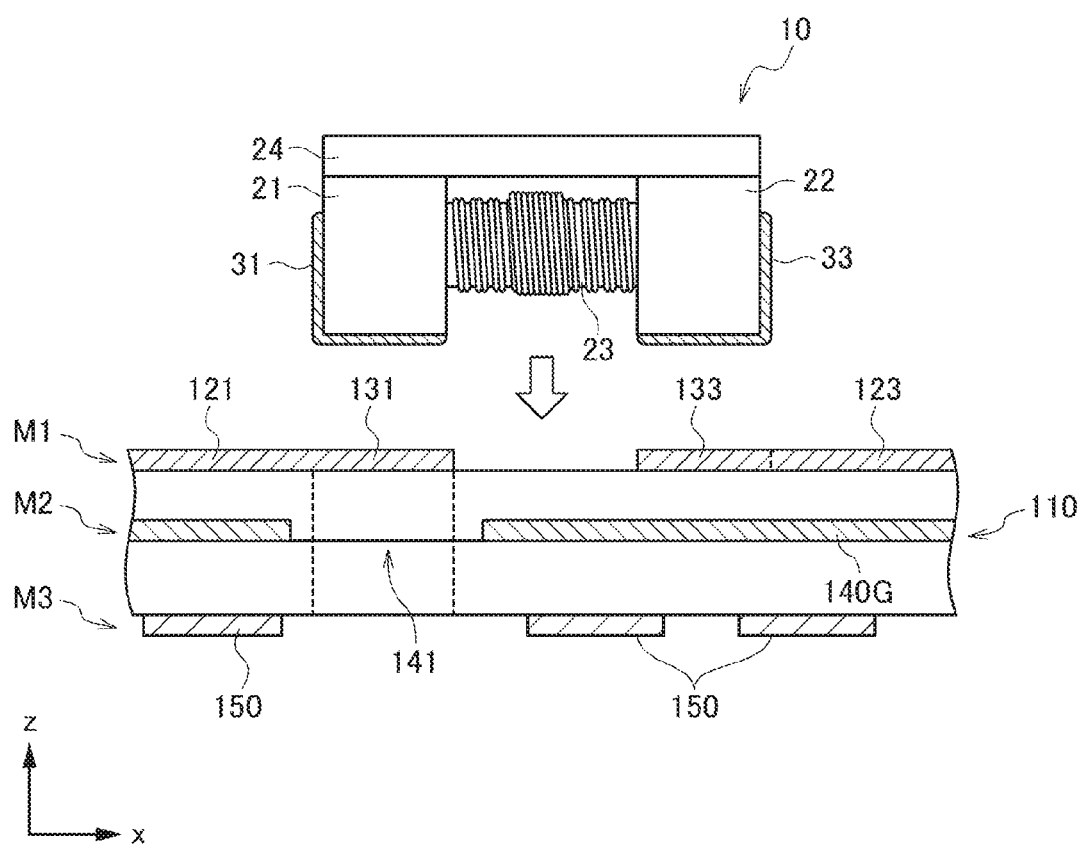
FIG. 14 is an example that a circuit board having a multi-layer structure is used.

For example, although the circuit board 110 has a single-layer structure in the above embodiment, it need not necessarily have the single-layer structure but may have a multi-layer structure as illustrated in FIG. 14. In the example illustrated in FIG. 14, a third wiring layer M3 on which wirings 150 are formed is additionally provided. Even in the case of using a circuit board 110 having such a structure, the same effects as those in the above embodiment can be obtained by providing the clearance region 141 in the ground pattern 140G. In this case, it is preferable not to form the wiring 150 in a region that overlaps the clearance region 141 in a plan view even in the third wiring layer M3.

Figure 15:
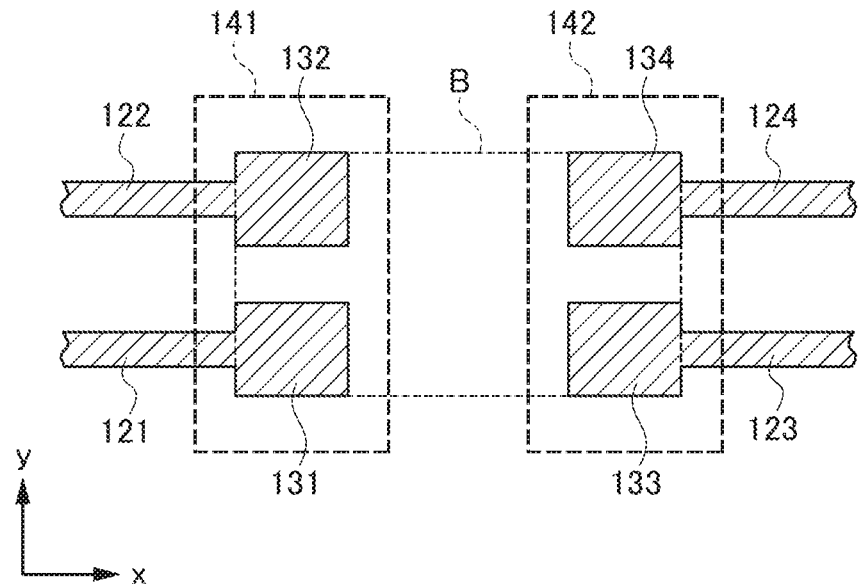
FIG. 15 is an example that another clearance region is additionally provided.
Figure 16:
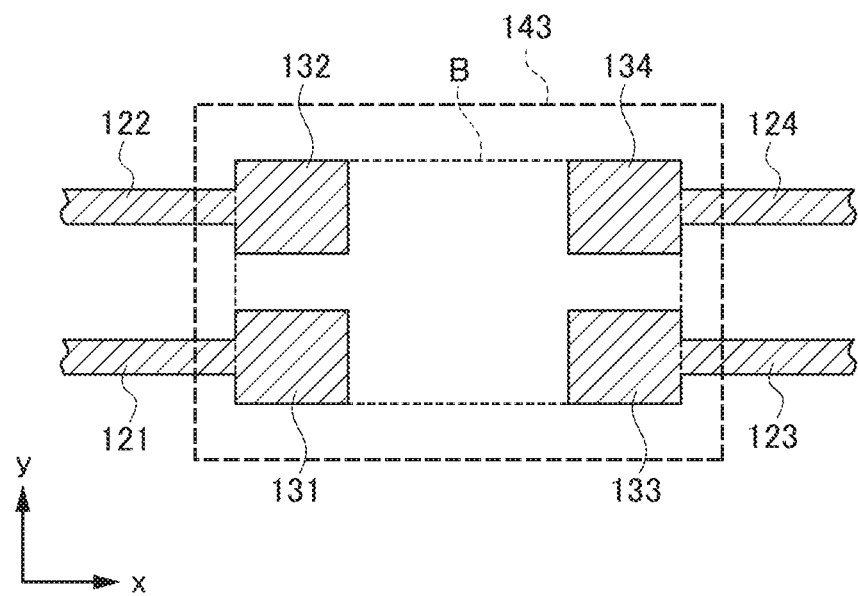
FIG. 16 is an example that a clearance region overlaps the entire mounting region.

Further, in the above embodiment, the clearance region 141 is provided only at a position overlapping the first and second land patterns 131 and 132; alternatively, however, as illustrated in FIG. 15, another clearance region 142 may additionally be provided at a position overlapping the third and fourth land patterns 133 and 134. This can suppress a variation in a capacitance component (output capacitance) generated on the output side of the common mode filter as well. Further, as illustrated in FIG. 16, a clearance region 143 may be provided so as to overlap the entire mounting region B including the first to fourth land patterns 131 to 134.

Further, although the common mode filters according to the above respective examples each have a configuration where the four terminal electrodes 31 to 34 are bonded to the core 20, the terminal electrodes 31 to 34 may be directly formed on the core 20 by using a conductive paste or the like.

What is claimed is:

1. An electronic circuit module comprising:
    a circuit board; and
    a common mode filter mounted on the circuit board, the common mode filter including first and second terminal electrodes constituting a first pair of terminal electrodes and third and fourth electrodes constituting a second pair of terminal electrodes,
    wherein the common mode filter further includes:
        a core having a winding core part, a first flange part provided at one end of the winding core part in an axial direction thereof, and a second flange part provided at another end of the winding core part in the axial direction, the first and second terminal electrodes being provided on the first flange, the third and fourth terminal electrodes being provided on the second flange, the winding core part including first, second, third, and fourth winding regions arranged in this order from the first flange part toward the second flange part;
        a first wire wound around the winding core part, the first wire having one end connected to the first terminal electrode and having another end connected to the third terminal electrode; and
        a second wire wound around the winding core part, the second wire having one end connected to the second terminal electrode and having another end connected to the fourth terminal electrode, the first and second wires crossing each other on the winding core part, the first and second wires being bifilar-wound in both the first and fourth winding regions and layer-wound in both the second and third winding regions, the first and second wires crossing each other between the second and third winding regions;
    wherein the circuit board includes:
        a first wiring layer having first, second, third, and fourth land patterns connected to the first, second, third, and fourth terminal electrodes, respectively, and first, second, third, and fourth wiring patterns connected to the first, second, third, and fourth land patterns, respectively; and
        a second wiring layer having a ground pattern that overlaps the first, second, third, and fourth wiring patterns without overlapping the first and second land patterns.

2. An electronic circuit module comprising:
    a circuit board; and
    a common mode filter mounted on the circuit board, the common mode filter including first and second terminal electrodes constituting a first pair of terminal electrodes and third and fourth electrodes constituting a second pair of terminal electrodes,
    wherein the circuit board includes:
        a first wiring layer having first, second, third, and fourth land patterns connected to the first, second, third, and fourth terminal electrodes, respectively, and first, second, third, and fourth wiring patterns connected to the first, second, third, and fourth land patterns, respectively; and
        a second wiring layer having a ground pattern that overlaps the first, second, third, and fourth wiring patterns without overlapping the first and second land patterns, the ground pattern further overlapping the third and fourth land patterns.

3. The electronic circuit module as claimed in claim 2, wherein the first and second wiring patterns are a pair of input wiring patterns which transmit a signal to be inputted to the common mode filter, and
    wherein the third and fourth wiring patterns are a pair of output wiring patterns which transmit a signal outputted from the common mode filter.

4. The electronic circuit module as claimed in claim 2, wherein the common mode filter further includes:
    a core having a winding core part, a first flange part provided at one end of the winding core part in an axial direction thereof, and a second flange part provided at another end of the winding core part in the axial direction, the first and second terminal electrodes being provided on the first flange, the third and fourth terminal electrodes being provided on the second flange;

a first wire wound around the winding core part, the first wire having one end connected to the first terminal electrode and another end connected to the third terminal electrode; and a second wire wound around the winding core part, the second wire having one end connected to the second terminal electrode and another end connected to the fourth terminal electrode, and wherein the first and second wires cross each other on the winding core part.

5. The electronic circuit module as claimed in claim 4, wherein the winding core part includes first, second, third, and fourth winding regions arranged in this order from the first flange part toward the second flange part, wherein the first and second wires are bifilar-wound in both the first and fourth winding regions and layer-wound in both the second and third winding regions, and wherein the first and second wires cross each other between the second and third winding regions.

6. The electronic circuit module as claimed in claim 5, wherein numbers of turns of the first and second wires in the first winding region and numbers of turns of the first and second wires in the fourth winding region are the same as each other, and wherein numbers of turns of the first and second wires in the second winding region and numbers of turns of the first and second wires in the third winding region are the same as each other.

7. The electronic circuit module as claimed in claim 5, wherein the second wire is wound on the first wire in the second winding region and the first wire is wound on the second wire in the third winding region.

8. A circuit board on which a common mode filter including first and second terminal electrodes constituting a first pair of terminal electrodes and third and fourth electrodes constituting a second pair of terminal electrodes is mounted, the circuit board comprising:

a first wiring layer including first, second, third, and fourth land patterns to be connected respectively to the first, second, third, and fourth terminal electrodes and first, second, third, and fourth wiring patterns connected respectively to the first, second, third, and fourth land patterns; and a second wiring layer including a ground pattern that overlaps the first, second, third, and fourth wiring patterns without overlapping the first and second land patterns, the ground pattern further overlapping the third and fourth land patterns.

9. The circuit board as claimed in claim 8, wherein the first and second wiring patterns are a pair of input wiring patterns which transmit a signal to be inputted to the common mode filter, and wherein the third and fourth wiring patterns are a pair of output wiring patterns which transmit a signal outputted from the common mode filter.

10. A circuit board comprising:

a first wiring layer including:

first and second wiring patterns extending in a first direction in parallel;

third and fourth wiring patterns extending in the first direction in parallel; and first, second, third and fourth land patterns connected to respective ends of the first, second, third and fourth wiring patterns, wherein the first and third land patterns are located adjacent to each other in the first direction without an intervention of any conductive pattern therebetween, the second and fourth land patterns are located adjacent to each other in the first direction without an intervention of any conductive pattern therebetween, the first and second land patterns are located adjacent to each other in a second direction perpendicular to the first direction without an intervention of any conductive pattern therebetween, and the third and fourth land patterns are located adjacent to each other in the second direction without an intervention of any conductive pattern therebetween; and a second wiring layer including a solid pattern overlapping at least the first, second, third and fourth wiring patterns, the solid pattern surrounding a clearance region that is free from a conductive pattern, the clearance region selectively overlapping the first and second land patterns.

11. The circuit board as claimed in claim 10, wherein the solid pattern is applied with a ground potential.

12. The circuit board as claimed in claim 10, wherein the first and second wiring layer are adjacent to each other without an intervention of any wiring layer therebetween.

13. The circuit board as claimed in claim 12, further comprising a third wiring layer, wherein the second wiring layer is located between the first and third wiring layers.

14. The circuit board as claimed in claim 13, wherein the third wiring layer includes a plurality of wiring patterns that do not overlap the first and second land patterns.

15. The circuit board as claimed in claim 14, wherein the first wiring layer is an uppermost one of a plurality of wiring layers.

16. The circuit board as claimed in claim 10, wherein the solid pattern further overlaps the third and fourth land patterns.

17. The circuit board as claimed in claim 10, wherein the solid pattern further surrounds another clearance region that is free from a conductive pattern, the another clearance region selectively overlapping the third and fourth land patterns.

18. The circuit board as claimed in claim 10, wherein the clearance region further overlaps the third and fourth land patterns.

* * * * *